(12) United States Patent
Weber et al.

(10) Patent No.: US 9,304,171 B2
(45) Date of Patent: Apr. 5, 2016

(54) COMPUTER-IMPLEMENTED METHOD FOR GENERATING SOFTWARE, A BATTERY, AND A MOTOR VEHICLE

(71) Applicants: Robert Bosch GmbH, Stuttgart (DE); Samsung SDI Co., Ltd., Yongin-si, Gyeonggi-do (KR)

(72) Inventors: Jochen Weber, Asperg (DE); Christoph Brochhaus, Aachen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/399,758

(22) PCT Filed: May 2, 2013

(86) PCT No.: PCT/EP2013/059155
§ 371 (c)(1),
(2) Date: Nov. 7, 2014

(87) PCT Pub. No.: WO2013/167462
PCT Pub. Date: Nov. 14, 2013

(65) Prior Publication Data
US 2015/0094891 A1    Apr. 2, 2015

(30) Foreign Application Priority Data

May 9, 2012  (DE) .................. 10 2012 207 668

(51) Int. Cl.
*B60L 9/00*    (2006.01)
*B60L 11/00*   (2006.01)
(Continued)

(52) U.S. Cl.
CPC .......... *G01R 31/3651* (2013.01); *B60L 11/1851* (2013.01); *G01R 31/3627* (2013.01); *G06F 8/71* (2013.01); *G06F 11/368* (2013.01); *H01M 10/425* (2013.01); *H01M 10/4207* (2013.01); *H01M 10/4257* (2013.01); *H01M 10/482* (2013.01); *H01M 2010/4271* (2013.01); *H01M 2010/4278* (2013.01); *H01M 2220/20* (2013.01)

(58) Field of Classification Search
USPC ........................................... 701/22
See application file for complete search history.

(56) References Cited

U.S. PATENT DOCUMENTS

2004/0015832 A1   1/2004  Stapp et al.
2005/0125778 A1*  6/2005  Fleegal .................. 717/136
(Continued)

FOREIGN PATENT DOCUMENTS

EP    0 219 993 A2    4/1987

OTHER PUBLICATIONS

International Search Report corresponding to PCT Application No. PCT/EP2013/059155, mailed Aug. 12, 2013 (German and English language document) (7 pages).

*Primary Examiner* — Maceeh Anwari
(74) *Attorney, Agent, or Firm* — Maginot, Moore & Beck LLP

(57) ABSTRACT

The disclosure relates to a computer-implemented method for generating software for a battery management unit. Said method comprises at least the step of: generating a central battery configuration. In addition, the disclosure relates to a battery that can be operated using the software, and to a motor vehicle which comprises such a battery.

9 Claims, 1 Drawing Sheet

(51) Int. Cl.
*G05D 1/00* (2006.01)
*G06F 7/00* (2006.01)
*G06F 17/00* (2006.01)
*G01R 31/36* (2006.01)
*H01M 10/42* (2006.01)
*H01M 10/48* (2006.01)
*G06F 9/44* (2006.01)
*G06F 11/36* (2006.01)
*B60L 11/18* (2006.01)

(56) References Cited

U.S. PATENT DOCUMENTS

2010/0262312 A1  10/2010  Kubota et al.
2011/0004427 A1   1/2011  Gorbold et al.

* cited by examiner

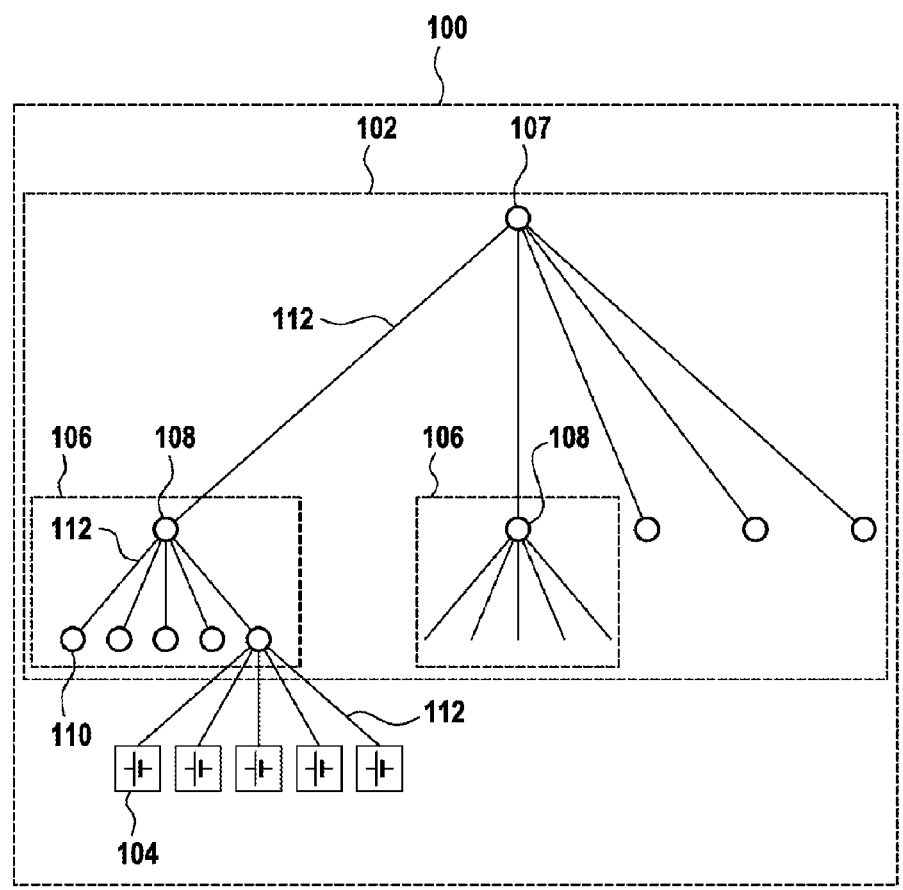

COMPUTER-IMPLEMENTED METHOD FOR GENERATING SOFTWARE, A BATTERY, AND A MOTOR VEHICLE

This application is a 35 U.S.C. §371 National Stage Application of PCT/EP2013/059155, filed on May 2, 2013, which claims the benefit of priority to Serial No. DE 10 2012 207 668.9, filed on May 9, 2012 in Germany, the disclosures of which are incorporated herein by reference in their entirety.

The present disclosure relates to a computer-implemented method for generating software for a battery management unit, to a battery which can be operated using the software, and to a motor vehicle having the battery.

BACKGROUND

Electronic control devices are nowadays being increasingly used in the automotive environment, for instance as engine control devices in anti-lock braking systems and in airbags. For electrically driven vehicles, it is necessary to develop battery systems with an associated battery management system, that is to say a control device having software for monitoring battery functionalities. Depending on customer requirements or the available installation space, the batteries are designed differently in terms of the number of battery components. As is known, the software in the control devices of these battery management systems must master a multiplicity of possible combinations of the battery components.

Typical battery management systems ensure the safe and reliable operation of the battery cells or batteries. They monitor and control currents, voltages, temperatures, insulation resistance and other variables for individual battery cells and for the entire battery. It is known practice to use these variables to implement battery management functions which increase the service life, the reliability and the safety of the battery system, as described, for instance, in DE 10 2011 082 937 which was filed before the present document and published thereafter.

Battery management systems consist of a multiplicity of control devices on which individual software functionalities run. On account of the different design of different batteries, there is a large amount of configuration effort for the software for operating the battery management systems. The testing of the different battery management systems is also complicated as a result.

SUMMARY

The disclosure provides a computer-implemented method for generating software for a battery management unit. The method according to the disclosure comprises at least the step of:

generating a central battery configuration.

A battery having a particular number of battery cells of at least one battery cell type, a communication network, and a battery management unit is also provided. The battery management unit comprises a particular number of battery cell sensors of at least one battery cell sensor type, and a particular number of cell monitoring units of at least one cell monitoring unit type, each cell monitoring unit having a sensor drive system which is connected to at least one battery cell sensor which monitors at least one of the battery cells. The battery management unit also comprises a control unit. The communication network has at least one particular topology. The communication network also connects the control unit, the sensor drive system and the battery cell sensor. The control unit can be operated using the software.

A motor vehicle having the battery is also provided, the battery being connected to a drive system of the motor vehicle.

The generation of a central battery configuration according to the disclosure substantially comprises in this case predetermining a fundamental topology of a battery, the fundamental topology of a battery describing, for example, a systematic description of spatial relationships between battery components and/or the compatibility of battery components with one another. In this context, the term "central" may mean one-off generation, generation at a central location or subsequent reuse of the battery configuration in further method steps and the like.

If the central battery configuration is used as the starting point for software code generation, that is to say if software is generated on the basis of the central battery configuration or is derived therefrom, inconsistencies in the software build can be avoided. The central battery configuration also makes it possible to easily replace or renew battery components since only the central battery configuration has to be changed, and software which is derived therefrom or based thereon can advantageously be generated without changing subsequent method steps. In addition, the choice of battery components can be extended, in which case only the central battery configuration is changed but not any subsequent method steps for generating software which is based on the changed central battery configuration. The generation of the central battery configuration also enables backward compatibility of software generated on the basis thereof. Another advantage of a central battery configuration lies in easier generation of software for a battery management unit; in particular, a high degree of complexity of a battery topology can be represented in the central battery configuration, with the result that generation of software on the basis thereof can be carried out with low complexity.

Correct operation of a battery management unit should generally be ensured by testing the latter. For example, the software of the battery management unit can be tested using test software during production, when started up for the first time or at repeated times. In order to be able to test different battery topologies, individual software builds are often necessary.

In one preferred development, the computer-implemented method may therefore also comprise the step of: generating a central test case catalog comprising, in particular, test cases for battery components of a battery.

A central test case catalog allows test software based thereon to be easily created and tests of individual battery management unit software to be carried out without having special know-how of the test cases for this. The central test case catalog can be easily changed and, in particular, expanded without having to change subsequent method steps for generating test software based thereon. The central test case catalog comprises a test case catalog which is generated once and can be reused in further method steps, in particular.

It is also preferred for the computer-implemented method to also comprise the step of: generating an individual battery configuration on the basis of a number and/or a type of battery components of a battery. The battery components comprise, in particular, battery cells, battery cell sensors and/or cell monitoring units. In addition, the individual battery configuration can be generated on the basis of a topology of a communication network which connects the battery components to one another. The generation of the individual battery configuration is based on the central battery configuration, in particular.

The individual battery configuration is preferably created using a markup language. The markup languages include, inter alia, XML (Extensible Markup Language). Markup languages and XML, in particular, are generally platform-independent and implementation-independent. In the method according to the disclosure, the markup language can be used to access and use the central battery configuration. The markup language fundamentally provides the advantage that it is easier to understand and easier to use than source code.

In one preferred development, the computer-implemented method according to the disclosure may also comprise the step of:
generating source code for the individual battery configuration for operating a battery management unit. Alternatively or additionally, the method may also comprise the step of:
generating source code for a cell monitoring unit of a battery management unit.

One advantage of the method according to the disclosure is that there is no need for any accurate knowledge of the battery components, for instance their compatibility, in order to create source code for different battery management units or cell monitoring units. Instead, it suffices to stipulate the number and type of cell monitoring units, battery cells and battery cell sensors, for example, using the markup language. Source code is then preferably generated using the individual battery configuration stipulated by the markup language and on the basis of the central battery configuration.

It is also preferred for the method according to the disclosure to also comprise the step of: generating source code of test cases on the basis of the individual battery configuration and on the basis of the central test case catalog.

Source code comprises, in particular, program code which can be read by people, that is to say text written in a programming language. In a similar manner to the generation of source code for the individual battery configuration, one advantage of the method according to the disclosure is that there is no need for any accurate knowledge of the battery components, for instance their compatibility, in order to create source code of test cases for different battery management units or cell monitoring units. Instead, it suffices to stipulate the number and type of cell monitoring units, battery cells and battery cell sensors, for example, for the individual battery configuration using the markup language and to generate the source code of test cases on the basis thereof and on the basis of the central test case catalog.

It is also preferred for the method according to the disclosure to also comprise the step of: compiling the source code to form a hex file. In this case, compiling comprises, in particular, translating or converting the source code into semantically similar machine code, for example the hex file. In this case, a hex file is substantially a binary file containing hexadecimal numbers, the term "hex file" being able to include any machine-readable code form. The hex file forms the software, in particular. The software is generated by appropriately generating the source code for an individual battery configuration. In a similar manner, the source code of test cases can be compiled to form a hex file and may form test software for a battery management unit or a cell monitoring unit.

In another refinement, it is preferred for the computer-implemented method to also comprise the step of:
creating simulations of battery components. Simulations of battery components comprise, in particular, virtual battery components, computation models of battery components or computer-implemented representations of battery components. In this step, the communication and behavior of a cell monitoring unit are preferably simulated. The behavior and communication of a cell monitoring unit can be derived, in particular, from the central battery configuration. Simulated battery components make it possible to test a battery management unit without actually present cell monitoring units. After running through a test or test case, it is possible to produce a test log which allows conclusions on errors in the software of the battery management unit.

The battery is preferably a lithium ion battery.

BRIEF DESCRIPTION OF THE DRAWINGS

Exemplary embodiments of the disclosure are explained in more detail using the drawings and the following description. In the drawings:

FIG. 1 shows a battery according to one exemplary embodiment of the disclosure.

DETAILED DESCRIPTION

FIG. 1 shows a battery 100 comprising a plurality of battery components. The battery components include: a battery management unit 102, a plurality of lithium ion battery cells 104 and a plurality of cell monitoring units 106. The battery management unit 102 comprises a control unit 107. The cell monitoring units 106 each comprise a sensor drive system 108 and a plurality of battery cell sensors 110.

The battery components 102, 104, 106, 107, 108, 110 are connected to one another by means of a communication network 112 as follows. The control unit 107 is respectively connected to the sensor drive systems 108. The sensor drive systems 108 are each connected to the battery cell sensors 110 of a cell monitoring unit 106. The battery cell sensors 110 are each connected to a plurality of battery cells 104. In the present example, the communication network 112 is designed with a star topology, that is to say it branches from the battery management unit 102 to the battery cells 104.

The method according to the disclosure for generating software is first of all used to create a central battery configuration of the battery 100 once. In this exemplary embodiment, the central battery configuration stipulates that the battery cell sensors 110 are of the voltage sensor type and that the battery cell sensors 110 are designed to monitor battery cells of the lithium ion battery cell 104 type. The central battery configuration also stipulates that the communication network 112 is of the CAN (Controller Area Network) bus type, that the communication network 112 has a star shape, and that the sensor drive systems 108 are designed to drive battery cell sensors of the voltage sensor type. In the same manner, further details of the compatibility of the battery components can be stipulated in the central battery configuration. The central battery configuration also comprises source code and rules for generating source code.

On the basis of the number of lithium ion battery cells 104, battery cell sensors 110 and sensor drive systems 108 and on the basis of the types of these battery components and of the communication network 112, an individual battery configuration is created in a further method step using XML (Extensible Markup Language), that is to say for example:
  100 battery cells of the lithium ion battery cell 104 type,
  20 battery cell sensors 110 of the voltage sensor type,
  five sensor drive systems 108, and
  a corresponding communication network 112. The quantities are only exemplary and are not intended to be restrictive.

The individual battery configuration can now be created in a subsequent method step only within the limits of the central battery configuration. The central battery configuration provides, for example, for the sensor drive systems 108 to be able to drive only voltage sensors, and therefore it is not possible to choose temperature sensors, for instance, instead of voltage sensors, that is to say, as a result, the generation of an individual battery configuration is safer and less susceptible to errors than directly programming source code for different batteries. In a further step, source code is generated from the individual battery configuration and a hex file is compiled therefrom. The hex file forms software which exactly matches the individual battery 100 as a result of the method described and can be easily generated. The method makes it possible to generate software both for the control unit 107 of the battery management unit 102 and for the sensor drive systems 108 of the cell monitoring units 106.

In addition to the software for operation, a battery generally also requires test software for testing the software of the battery management unit 102 and of the control unit 107 and for testing the software of the cell monitoring units 106 and of the sensor drive systems 108.

A central test case catalog can be created once for this purpose on the basis of the central battery configuration. On the basis of the individual battery configuration, test software source code matching the individual battery configuration can be generated using the central test case catalog and can then be compiled to form a hex file. If the software of the control unit 107 and of the battery management unit 102 is intended to be tested without actually available cell monitoring units 106, simulations, that is to say virtual emulations, of cell monitoring units 106 are created, which emulate the communication and behavior of an actual cell monitoring unit. The simulations of the cell monitoring units are derived from the central battery configuration.

Individual test cases derived from the central test case catalog for the test software of the individual battery configuration of the battery 100 are as follows:

"test whether the voltage at lithium ion battery cell 104 number one is correctly recorded at sensor drive system 108 number one";

"test whether the voltage at lithium ion battery cell 104 number two is correctly recorded at sensor drive system 108 number one"

and so on until

"test whether the voltage at lithium ion battery cell 104 number one hundred is correctly recorded at sensor drive system 108 number five".

The computer-implemented method and, in particular, the software provided thereby can be used in lithium ion batteries. The batteries in turn can be used in motor vehicles in which they increase the vehicle reliability, for example.

The invention claimed is:

1. A battery management system comprising:
    a plurality of battery cells;
    a plurality of cell monitoring units connected to the plurality of battery cells, each cell monitoring unit comprising:
        a sensor drive system; and
        at least one battery cell sensor connected to at least one battery cell in the plurality of battery cells; and
    a central management unit operatively connected to the plurality of cell monitoring units, the central management unit comprising:
        a control unit operatively connected to the sensor drive system in each cell monitoring unit of the plurality of cell monitoring units, the control unit being configured to:
            retrieve a first test case for the first cell monitoring unit in the plurality of cell monitoring units from a central test case catalog;
            identify a first type of the sensor drive system in the first cell monitoring unit and a second type of the at least one battery cell sensor with reference to predetermined configuration data in the battery management system;
            generate a first compiled executable for the first test case corresponding to the first type of the sensor drive system and the second type of the at least one battery cell sensor in the first cell monitoring unit; and
            transmit the first executable to the first cell monitoring unit for execution by the sensor drive system in the first cell monitoring unit.

2. The battery management system of claim 1, the control unit in the central management unit being further configured to:
    retrieve a second test case for a second cell monitoring unit in the plurality of cell monitoring units from the central test case catalog;
    identify a third type of the sensor drive system in the second cell monitoring unit and a fourth type of the at least one battery cell sensor in the second cell monitoring unit with reference to the predetermined configuration data in the battery management system;
    generate a second compiled executable for the second test case corresponding to the third type of the sensor drive system and the fourth type of the at least one battery cell sensor in the second cell monitoring unit; and
    transmit the second executable to the second cell monitoring unit for execution by the sensor drive system in the first cell monitoring unit.

3. The battery management system of claim 2 wherein the first type of sensor drive system in the first cell monitoring unit differs from the third type of sensor drive system in the second cell monitoring unit.

4. The battery management system of claim 2 wherein the second type of the at least one sensor in the first cell monitoring unit differs from the fourth type of the at least one sensor in the second cell monitoring unit.

5. The battery management system of claim 1, the sensor drive system in the first cell monitoring unit being configured to:
    execute the first compiled executable to test a voltage measured by one voltage measurement sensor in the at least one battery cell sensor in the first cell monitoring unit.

6. The battery management system of claim 5 wherein the communication network is a controller area network (CAN).

7. The battery management system of claim 1 further comprising:
    a communication network communicatively coupled to the central management unit and the plurality of cell monitoring units; and
    the central processor in the central management unit being further configured to:
        identify a third type of the communication network with reference to the predetermined configuration data in the battery management system; and
        generate the first compiled executable for the first test case corresponding to the third type of the communication network to enable the first cell monitoring unit to transmit a result of the first test case to the central management unit through the communication network.

8. The battery management system of claim 7, the sensor drive system in the first cell monitoring unit being further configured to:
- execute the first compiled executable to test a voltage measured by one voltage measurement sensor in the at least one battery cell sensor in the first cell monitoring unit; and
- execute the first compiled executable to transmit a result of the test for the one voltage measurement sensor to the central processor in the central management unit using the communication network.

9. The battery management system of claim 1, the central processor in the central management unit being further configured to:
- execute stored program instructions to perform a simulation of the first battery cell monitoring unit; and
- execute the first compiled executable to perform the first test case with the simulation of the first battery cell monitoring unit.

* * * * *